United States Patent [19]

Flannagan et al.

[11] Patent Number: 4,716,550

[45] Date of Patent: Dec. 29, 1987

[54] HIGH PERFORMANCE OUTPUT DRIVER

[75] Inventors: Stephen T. Flannagan; Paul A. Reed, both of Austin, Tex.

[73] Assignee: Motorola, Inc., Schaumburg, Ill.

[21] Appl. No.: 882,569

[22] Filed: Jul. 7, 1986

[51] Int. Cl.$^4$ .............................................. G11C 13/00
[52] U.S. Cl. ..................................... 365/207; 365/189
[58] Field of Search ................ 365/189, 190, 207, 154

[56] References Cited

U.S. PATENT DOCUMENTS 4,539,658 9/1985 Shimohigashi et al. ............ 365/207

Primary Examiner—Terrell W. Fears

Attorney, Agent, or Firm—John A. Fisher; Jeffrey Van Myers; James L. Clingan, Jr.

[57] ABSTRACT

A memory, which has an amplifying circuit which provides a pair of differential signals representative of data contained in a memory cell selected by an address, has an output driver which receives this pair of differential signals on a pair of input lines. The output driver is tri-stated in response to an address transition so that the output driver provides only either valid data or a high impedance. The data provided by the differential signals is latched on the input lines by data latches after a predetermined time delay if new valid data has not appeared. The data latches used add less capacitance to the pair of input lines than those used previously.

8 Claims, 4 Drawing Figures

HIGH PERFORMANCE OUTPUT DRIVER

FIELD OF THE INVENTION

The present invention relates to output drivers and more particulary to output drivers for use in a memory.

BACKGROUND OF THE INVENTION

In a typical memory an output driver is not tri-stated during the time that the memory is not providing a valid output. One of the disadvantages of this has been that the output driver will tend to be driven to a predetermined state which is independent of the valid data. When the valid data is of the opposite polarity of the predetermined state, the output driver will often drive first to the predetermined state and then correct to the valid state. This is an unnecessary transition which wastes power and temporarily puts false data on its output. This can be corrected by holding the output driver in the tri-stated condition until the data is valid. This requires extremely accurate timing to avoid adding delay to the access time. As a practical matter such a solution does add to the access time.

Another desirable characteristic is high speed. Capacitive loading has a negative affect on speed and power. Accordingly, any way that capacitive loading can be reduced is generally desirable. Noise immunity can be a consideration. Size of the circuitry is always a consideration. Size of the circuitry is dependent upon not only the number of devices but also the size of the devices themselves. Speed is dependent also upon gain. It is advantageous to have the devices operate in the optimum gain range so that more gain is obtained for given device sizes. Increasing device size to obtain more gain also generally adds more capacitance which is also disadvantageous.

In the past a data driver latched data a predetermined time after the data became valid. The latch, however, adds undesirable capacitance to the line to which the latch is coupled. There are generally two lines on which a differential voltage is developed. This differential voltage is indicative of the data. It is desirable that these two lines have low capacitance. In order to implement the latch there is generally some cross-coupling between the two lines. In the past this cross-coupling drives both P and N channel transistors which are relatively large devices and so add substantial capacitance to the lines.

SUMMARY OF THE INVENTION

An object of the present invention is to provide an improved output driver.

Another object of the invention is to provide an improved tri-state output driver.

Yet another object of the invention is to provide an improved tri-state output driver for use in a memory.

These and other objects are achieved in a memory having an array of memory cells, each memory cell for containing data therein in the form of a first pair of differential signals; decoder means for selecting a memory cell in response to an address; transition detection means for providing a pulse in response to a transition of the address; a sense amplifier for receiving data from the selected memory cell and for providing a pair of differential signals representative of the data received from the selected memory cell; and an output driver. The output driver comprises a first input line for receiving a first signal of the pair of differential signals; a second input line for receiving a second signal of the pair of differential signals; a tri-state circuit for applying predetermined logic states to the first and second input lines in response to said pulse; a first transistor having a first current electrode coupled to a first power supply terminal, a second current electrode for providing an output signal of the memory, and a control electrode; a first logic gate, having a first input coupled to the first input line, an output coupled to the control electrode of the first transistor, and a second input for receiving a disable signal, for providing said output at a logic state which causes the first transistor to be non-conductive when the disable signal is present and for providing said output at a logic state responsive to a logic state present on the first input line when the disable signal is not present, said logic state which causes the first transistor to be non-conductive being provided in response to the predetermined logic state provided to the first input line by the tri-state means in response to the pulse; a second transistor having a first current electrode coupled to a second power supply terminal, a second current electrode coupled to the second current electrode of the first transistor, and a control electrode; and s second logic gate, having a first input coupled to the second input line, an output coupled to the control electrode of the second transistor, and a second input for receiving the disable signal, for providing said output at a logic state which causes the second transistor to be non-conductive when the disable signal is present and for providing said output at a logic state responsive to a logic state present on the second input line when the disable signal is not present, said logic state which causes the second transistor to be non-conductive being provided in response to the predetermined logic state provided to the second input line by the tri-state means in response to the pulse.

DESCRIPTION OF THE INVENTION

Figure 1:
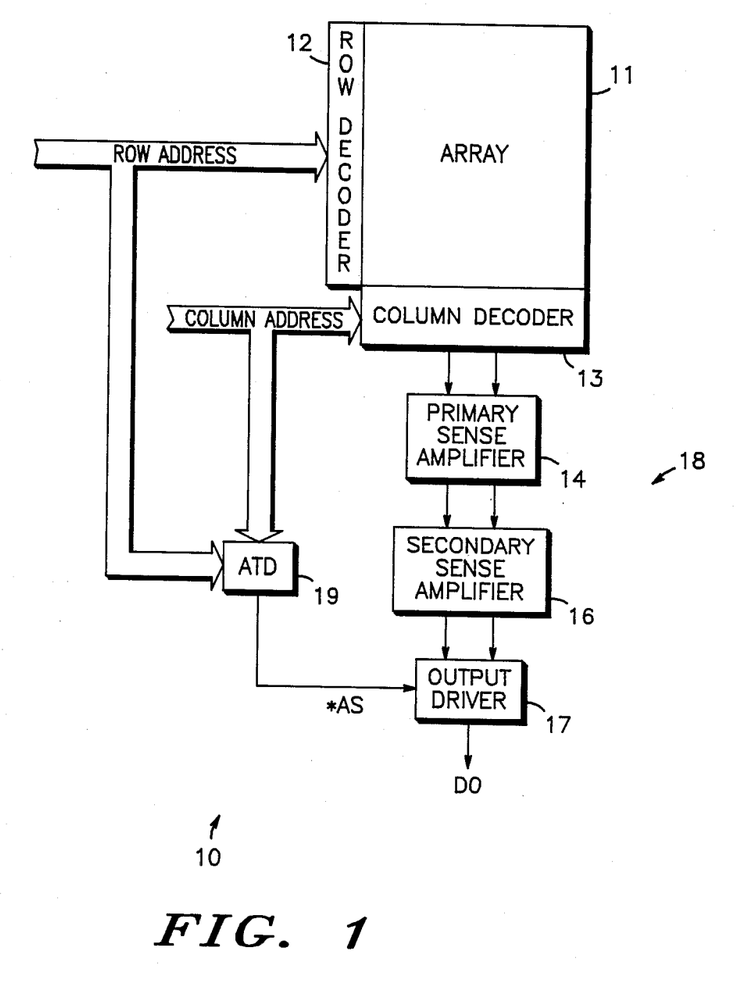
FIG. 1 is a block diagram of a memory according to a preffered embodiment of the invention.

Shown in FIG. 1 is a conventional memory 10 comprised generally of an array 11, a row decoder 12, a column decoder 13, a primary sense amplifier 14, a secondary sense amplifier 16, an output driver 17, and an address transition detector 19. Array 11 contains a plurality of static random access memory (SRAM) cells located at intersections of word lines and bit line pairs. Primary sense amplifier 14, secondary sense amplifier 16, and output driver 17 comprise an output circuit 18. Row decoder 12 selects a word line in array 11 as determined by a row address. When memory 10 is in a read mode, column decoder 13 couples a selected bit line pair, as determined by a column address, to primary sense amplifier 14. The data contained in the memory cell coupled to the selected word line and to the selected bit line pair is thereby communicated to primary sense amplifier 14 in the form of a differential voltage developed on the selected bit line pair. The differential voltage developed by on the selected bit line pair is amplified by primary sense amplifier 14 and coupled to secondary amplifier 16. Secondary amplifier 16 provides further amplification and provides complementary outputs to output driver 17. Output driver 17 then provides a single output of a logic state representative of the logic state of the selected memory cell. Transition detector 19 provides an address stable signal *AS to output driver 17 in response to an address transition. When the address, comprised of the the column and row address signals, has become stable, signal *AS switches back to a logic low. Output driver 17 is tristated in response to signal *AS pulsing to a logic high. The operation of output driver 17 is described in more detail in the description of FIG. 4.

Except for this use of address transition, this is conventional operation for a SRAM that is being read. Various other signals (not shown) are generated to provide proper control of output circuitry such as output circuit 18. For example, output circuit 18 should be disabled when memory 10 is disabled or in the write mode. Memory 10 receives external signals (not shown), such as chip enable and write enable, to generate the signals required for controlling output circuit 18. Other conventional operational characteristics, such as the use of address transition detection for bit line precharge, are also not shown or described.

Figure 2:
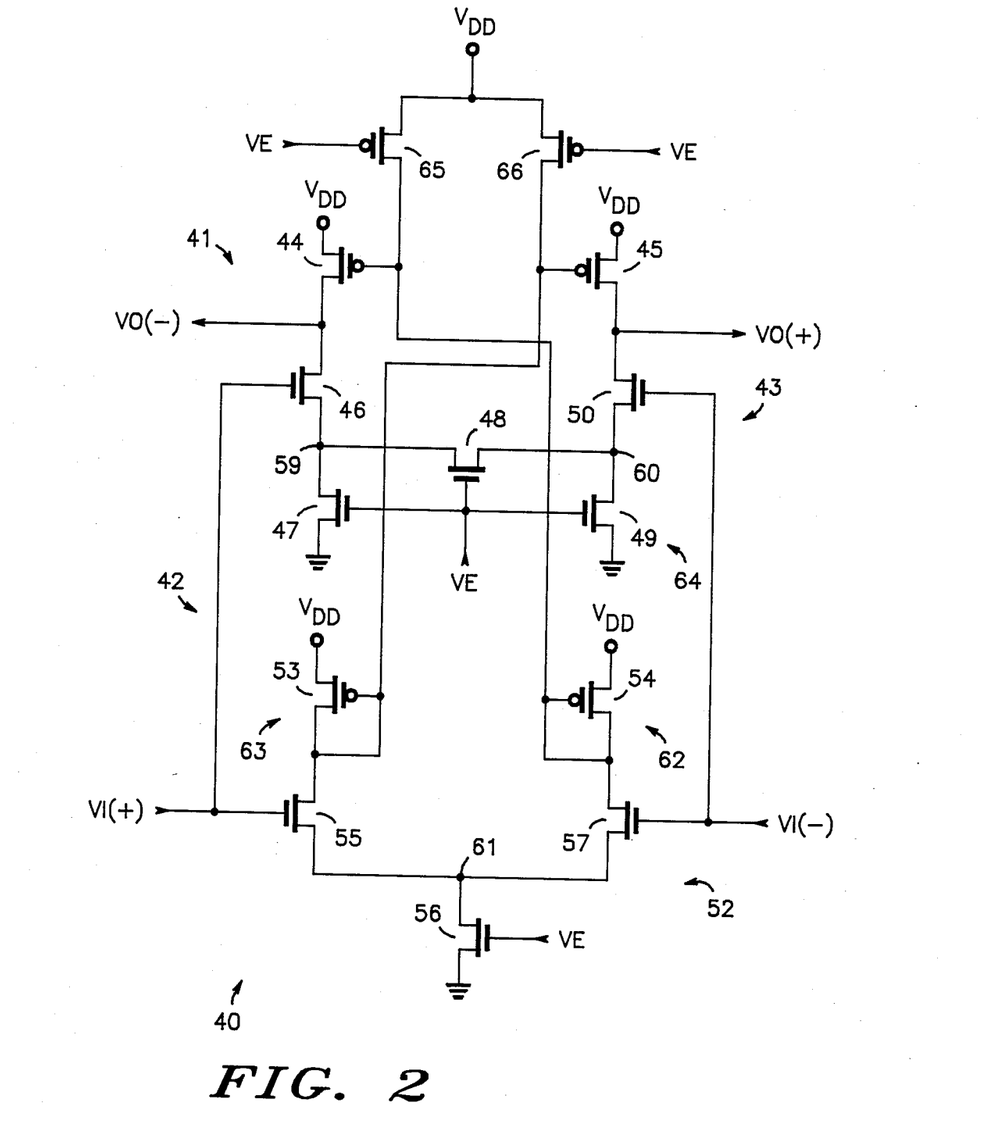
FIG. 2 is a circuit diagram of a primary sense amplifier for use in the memory of FIG. 1.
Figure 3:
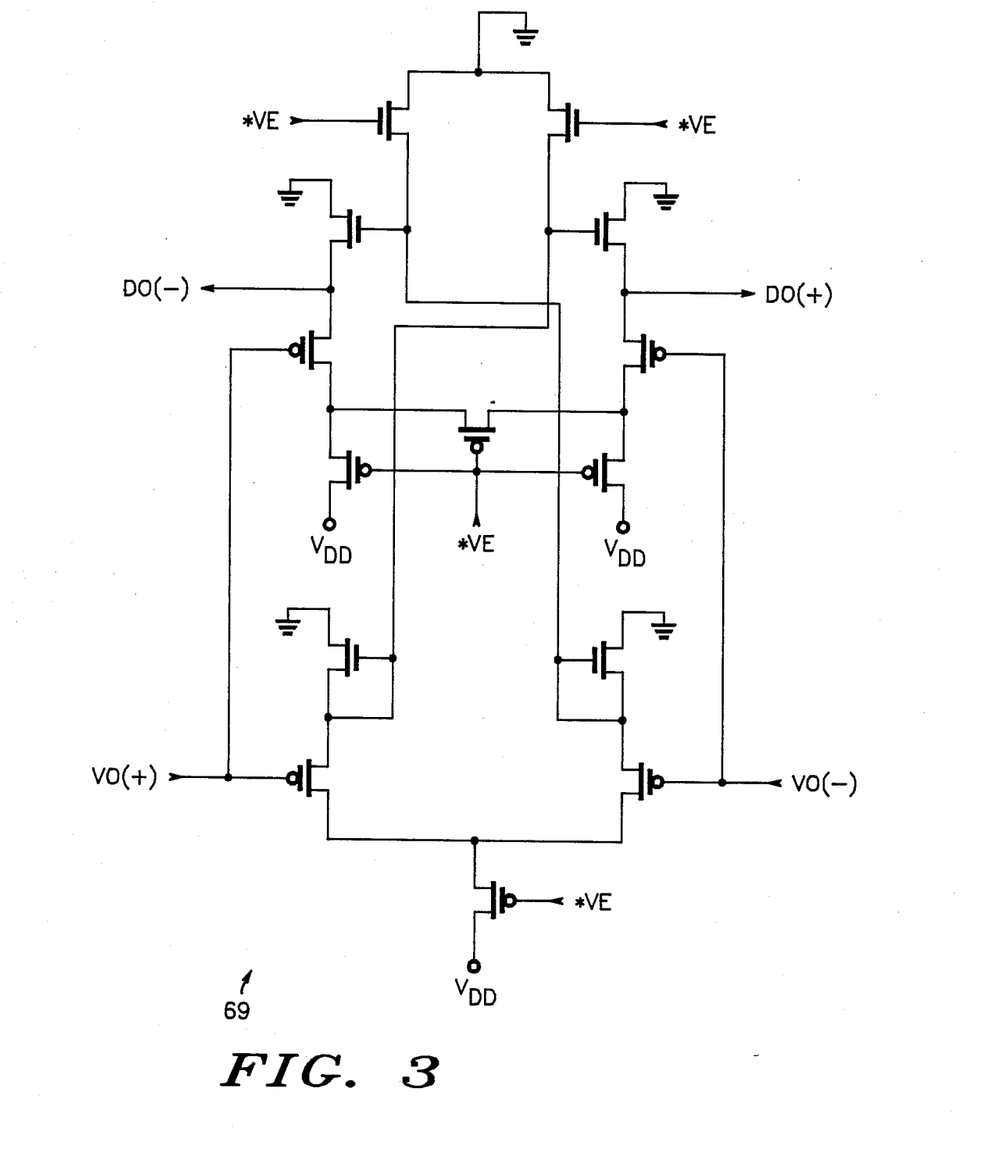
FIG. 3 is a circuit diagram of a secondary sense amplifier for use in the memory of FIG. 1.
Figure 4:
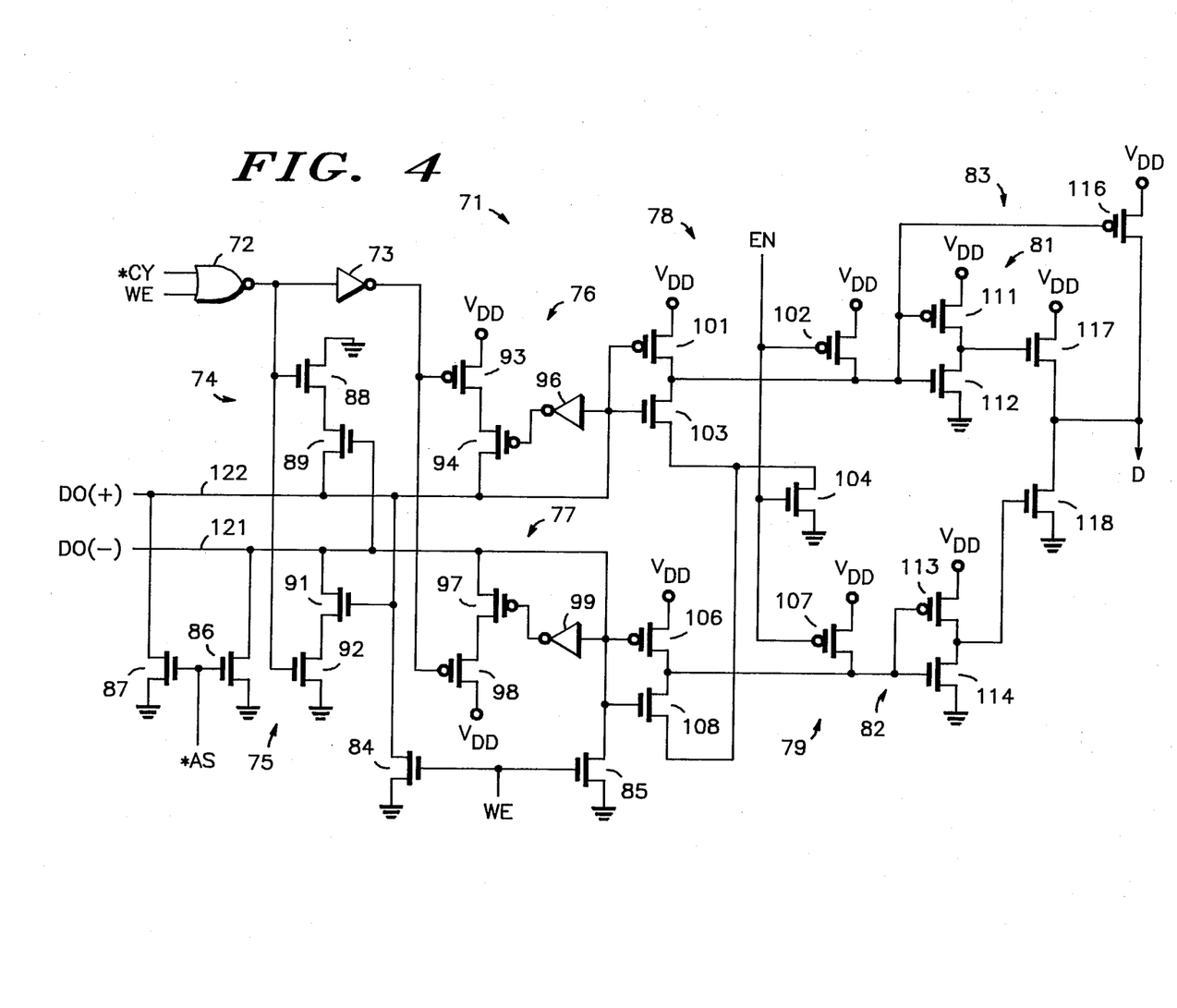
FIG. 4 is a circuit diagram of an output driver for use in the memory of FIG. 1 according to a preffered embodiment of the invention.

Although this general operation of an output circuit for a SRAM, except for the operation of output driver 17 in response to signal *AS, is conventional, the way that this general operation is carried out is subject to improvement. Shown in FIGS. 2, 3, and 4 are a novel primary sense amplifier 40, a novel secondary sense amplifier 69, and a novel output driver 71. These are also interconnected in a manner for improving performance.

Shown in FIG. 2 is a sense amplifier 40 useful as sense amplifier 14 of FIG. 1 comprised generally of a differential portion 41 and a differential portion 42. Differential portion 41 comprises a differential amplifier 43, a P channel load transistor 44, and a P channel load transistor 45. Differential amplifier 43 comprises N channel transistors 46, 47, 48, 49, and 50. Differential portion 42 comprises a differential amplifier 52, a P channel load transistor 53, and a P channel load transistor 54. Differential amplifier 52 comprises N channel transistors 55, 56 and 57.

Transistor 44 has a source connected to VDD, a drain for providing complementary output signal VO(−), and a gate. Transistor 46 has a drain connected to the drain of transistor 44, a gate for receiving the input signal VI(+), and a source connected to a node 59. Transistor 47 has a drain connected to node 59, a gate for receiving enable signal VE, and a source connected to ground. Transistor 48 has a first current electrode connected to node 59, a gate for receiving signal VE, and a second current electrode connected to a node 60. Transistor 49 has a drain connected to node 60, a gate for receiving signal VE, and a source connected to ground. Transistor 50 has a source connected to node 60, a gate for receiving complementary input signal VI(−), and a drain for providing true output signal VO(+). Transistor 45 has a drain connected to the drain of transistor 50, a source connected to VDD, and a gate. Transistor 53 has a source connected to VDD, a gate and a drain connected to the gate of transistor 45. Transistor 55 has a drain connected to the gate and drain of transistor 53, a gate for receiving signal VI(+), and a source connected to a node 61. Transistor 56 has a drain connected to node 61, a gate for receiving signal VE, and a source connected to ground. When enabled by signal VE, transistor 56 acts as a current source for differential amplifier 52. Transistor 57 has a source connected to node 61, a gate for receiving signal VI(−), and a drain. Transistor 54 has a gate and drain connected to the drain of transistor 57, and a source connected to VDD.

Transistors 44 and 54 comprise a current mirror 62, and transistors 45 and 53 comprise a current mirror 63. Transistor 44 is a slave and transistor 54 is a master of current mirror 62. Transistor 45 is a slave and transistor 53 is a master of current mirror 63. The slaves, transistors 44 and 45, of current mirrors 62 and 63 are the loads for differential amplifier 43. The masters, transistors 53 and 54, are the loads for differential amplifier 52. During sensing by sense amplifier 40, signal VE is a logic high so that transistors 47–49 and 56 are conducting. Transistor 48 acts as an equalizing transistor to keep nodes 59 and 60 at the same voltage. Transistors 47 and 49 act as current sources for differential amplifer 43. For sensing purposes, transistors 47–49 could be replaced by a single transistor, such as transistor 56, with nodes 59 and 60 connected together. Such transistor would have its drain connected to nodes 59 and 60, its source connected to ground, and its gate for receiving signal VE. Transistors 47–49 are used as part of a novel tri-state technique having merit independent of that of the novel arrangement of differential amplifiers and current mirrors of sense amplifier 40.

For sensing in the case in which signal VI(+) is reduced in voltage, transistors 46 and 55 become less conductive in response to signal VI(+). With transistor 55 becoming less conductive, less current flows through transistor 53 and more current flows through transistor 54 via transistor 57. With the master, transistor 53, of current mirror 63 having reduced current, the slave, transistor 45, also has reduced current. Conversely, with the master, transistor 54, of current mirror 62 having increased current, the slave, transistor 44, has increased current carrying capability. Because transistor 46 has reduced conductivity and transistor 44 has increased conductivity, output signal VO(−) will rise in voltage. Transistor 50 will actually become more conductive even if input signal VI(−) does not rise in voltage because there will be reduced current flowing into equalized nodes 59 and 60 causing the voltage at equalized nodes 59 and 60 to be reduced. With transistor 50 having increased conductivity and transistor 45 having reduced conductivity, output signal VO(+) will drop in voltage. Thus, a drop in voltage by input signal VI(+) causes output signal VO(−) to rise and output signal VO(+) will drop in voltage. Thus, a drop in voltage by input signal VI(+) causes output signal VO(−) to rise and output signal VO(+) to drop, which is the desired result. If input signal VI(+) drops sufficiently low to cause transistors 46 and 55 to become non-conducting, no current will flow through transistor 53 and there will be no current contribution to equalized nodes 59 and 60 from transistor 44. With the master, transistor 53, of current mirror 63 being non-conducting, the slave, transistor 45, is also non-conducting. With transistors 46 and 45 being non-conducting, the only current flowing into equalized nodes 59 and 60 will come externally from amplifier 40 via transistor 50. Consequently, signal VO(+) can actually reach ground potential. Likewise, signal VO(−) can actually reach the potential at VDD.

There is one current path within amplifier 40. Transistors 54, 57 and 56 are all conducting. This current path is analogous to the current path through transistors 22, 23 and 15 of prior art FIG. 1 when input signal VI(+) is a logic low. The difference being that current can be reduced by reducing the gain of the master, transistor 54, without causing a gain mismatch in a differential amplifier. The load transistors have a gain selected to meet drive requirements of the amplifier. Consequently, the gain of transistors 44 and 45 is selected based upon the load driving requirments for output signals VO(−) and VO(+). Transistor 54 can have a gain substantially reduced from that required for transistor 44 because transistor 57 can have a commensurate reduction in gain but still have the same gain as transistor 55. This is because transistor 53 has the same reduction in gain in relation to transistor 45 that transistor 54 has in relation to transistor 44. Consequently, transistor 55 is reduced in gain so that transistors 55 and 57 have the same gain, which is the desired result. Gain is typicallly altered by altering channel width. Consequently, reducing the gain of transistors 53, 54, 55 and 57 results in reducing the size of these transistors. This is particularly significant for the use in a memory because a sense amplifier is used for every group of columns on a data path. Sense amplifier 40 thus saves space and power.

Amplifier 40 thus has two pairs of common source transistors, each pair of which has matched gain. Transistor pair 55, 57 and trasistor pair 46, 50 each are thus optimized. Transistor load pair 53, 54 also is matched as is transistor load pair 44 and 45. The output of transistor pair, 55, 57 controls the conductivity of load transistors 44, 45. Instead of the output of differential amplifier 52 being simply cascaded with another amplifier, the output of diferential amplifier 52 is used to vary the load, transistors 44 and 45, of an amplifier, differential amplifier 43, which is connected in parallel. Consequently, the gain of differential amplifier 52 is used to an advantage without causing an additional propagation delay which is true of cascaded amplifiers.

Transistors 47–49 form a tri-state configuration 64 which is used to replace a resistive component in a differential amplifier to enable the differential amplifier to obtain a tri-state condition. When signal VE is a logic high, transistors 47 and 49 act as resistive elements for differential amplifier 43, and transistor 48 equalizes nodes 59 and 60. Transistors 47 and 49 are each chosen to be half of the gain that is required for desired operation of differential amplifier 43. Consequently, transistors 47 and 49 conducting together supply the desired gain. Transistor 48 ensures that nodes 59 and 60 are maintained at the same voltage which is required for proper operation of differential amplifier 43.

When high impedance outputs are desired, signal VE switches to a logic low causing transistors 47–49 to become non-conducting. The sources of transistors 46 and 50 are then isolated from ground and each other. Consequently, there is no path to ground or to transistor 50 through transistor 46. Likewise, there is no path to ground or to transistor 46 through transistor 50. Sense amplifier 40 further comprises P channel transistors 65 and 66 for turning off load transistors 44, 45, 53 and 54. Transistor 65 has a source connected to VDD, a gate for receiving signal VE, and a drain connected to the gate of transistor 44. Transistor 66 has a source connected to VDD, a gate for receiving signal VE, and a drain connected to the gate of transistor 45. In the high impedance condition with signal VE at a logic low, transistors 65 and 66 couple the potential at VDD to the gates of transistors 44 and 45, respectively, causing transistors 44 and 45 to be non-conducting. A high impedance is thus provided at the connection of the drains of transistors 44 and 46 and at the connection of the drains of transistors 45 and 50. The high impedance state is commonly referred to as tri-state, there being three conditions; logic high, logic low and high impedance. Consequently, sense amplifier 40 is a tri-state sense amplifier in which signals VO(+) and VO(−) provided by sense amplifier 40 can represent a logic high, a logic low, or a high impedance condition. If the sources of transistors 46 and 50 were connected together as in a conventional differential amplifier, signals VO(−) and VO(+) would not be isolated from each other. When sense amplifier 40 is to be in a high impedance condition, signals from other sources on lines that signals VO(+) and VO(−) are coupled to, may be present. It is undesirable that such signals be coupled to each other via transistors 46 and 50 which would occur because transistors 46 and 50 will be conducting with 3 volts on their gates. Transistor 48 effectively couples nodes 59 and 60 for a sensing operation and effectively separates them for high impedance operation. Additionally, the tri-state technique does not interfere with the output drive of sense amplifier 40. Although transistor 48 must be relatively large in relation to the other N channel transistors of amplifier 40, it operates in its highest gain region because nodes 59 and 60 will be relatively low in voltage, typically one volt or lower. If a transistor is interposed between the drain connections of transistors 44 and 46 and transistors 45 and 50, the transistor would be more effective in coupling one logic state than the other. If both P and N channel devices are used, some additional resistance is still present, the devices must still be quite large for sufficient gain, and the part count is proliferated. The present technique also requires four extra transistors but only one is large and there is not nearly as much extra series impedance. In fact, for the logic high outputs, there is no extra series impedance. The extra impedance introduced by transistor 48 to ground via nodes 59 and 60 is relatively low.

Sense amplifier 40 thus has improved tri-state operation, reduced current consumption, and a reduced area requirement. For amplifier 40, all of the gate lengths are 1.3 microns. Transistors 44, 45 and 48 each have a channel width of 100 microns. Transistors 53 and 54 each have a channel width of 40 microns. Transistors 46 and 50 each have a channel width of 30 microns. Transistors 47 and 49 each have a channel width of 22 microns. Transistors 55 and 57 each have a channel width of 10 microns. Transistor 56 has a channel width of 45 microns.

Shown in FIG. 3 is an amplifier 69 for receiving the output signals VO(+) and VO(−) of amplifier 40 of FIG. 2 and providing data output signals DO(+) and DO(−) in response thereto. Amplifier 69 is useful as secondary sense amplifier 16 of FIG. 1. Amplifier 69 is the same as amplifier 40 except that it is complementary which means that the N channel transistors of amplifier 40 become P channel transistors in amplifier 69, the P channel transistors in amplifier 40 become N channel transistors in amplifier 69, the power supply polarities are reversed, and the enable signal VE is complemented. Consequently, N channel differential amplifiers 52 and 43 become P channel differential amplifiers, and P channel load pairs 44, 45 and 53, 54 become two N channel load pairs. This scheme matches the common-mode biasing level of the output of one amplifier section, amplifier 40, to the optimum level for the input of the subsequent amplifier section, amplifier 69. This results in a large improvement in gain and power characteristics. The gain of amplifier 69 is higher when its outputs are biased to a logic low than when its outputs are biased to a logic high.

Shown in FIG. 4 is an output driver 71 useful as output driver 17 of FIG. 1 comprised generally of a NOR gate 72, an inverter 73, a latch 74, a latch 75, a latch 76, a latch 77, a NAND gate 78, a NAND gate 79, an inverter 81, an inverter 82, an output drive circuit 83, an N channel transistor 84, an N channel transistor 85, an N channel transistor 86, and an N channel transistor 87. Latch 74 comprises N channel transistors 88 and 89. Latch 75 comprises N channel transistors 91 and 92. Latch 76 comprises P channel transistors 93 and 94 and an inverter 96. Latch 77 comprises P channel transistors 97 and 98 and an inverter 99. NAND gate 78 comprises P channel transistors 101 and 102 and N channel transistors 103 and 104. NAND gate 79 comprises P channel transistors 106 and 107, an N channel transistor 108, and also transistor 104. Transistor 104 is shared by NAND gates 78 and 79. Inverter 81 comprises a P channel transistor 111 and an N channel transistor 112. Inverter 82 comprises a P channel transistor 113 and an N channel transistor 114. Output drive circuit 83 comprises a P channel transistor 116 and N channel transistors 117 and 118.

Transistor 86 has a drain connected to a secondary amplifier output line 121, a gate for an address stable signal *AS, and a source connected to ground. Transistor 87 has a drain connected to a secondary amplifier output line 122, a gate for receiving address stable signal *AS, and a source connected to ground. NOR gate 72 has a first input for receiving a cycle end timer signal *CY, a second input for receiving a write enable signal WE, and an output. Inverter 73 has an input connected to the output of NOR gate 72, and an output. Transistor 88 has a gate connected to the output of NOR gate 72, a source connected to ground, and a drain. Transistor 89 has a drain connected to line 122, a gate connected to line 121, and a source connected to the drain of transistor 88. Transistor 91 has a gate connected to line 122, a drain connected to line 121, and a source. Transistor 92 has drain connected to the source of transistor 91, a gate connected to the output of NOR gate 72, and a source connected to ground. Transistor 93 has a source connected to VDD, a gate connected to the output of inverter 73, and a drain. Transistor 94 has a source connected to the drain of transistor 93, a drain connected to line 122, and a gate. Inverter 96 has an input connected to line 122, and an output connected to the gate of transistor 94. Transistor 97 has a drain connected to line 121, a gate, and a drain. Transistor 98 has a gate connected to the output of inverter 73, a drain connected to the source of transistor 97, and a source connected to VDD. Inverter 99 has an input connected to line 121, and an output connected to the gate of transistor 97. Transistor 101 has source connected to VDD, a gate connected to line 122, and a drain. Transistor 102 has a source connected to VDD, a gate for receiving an enable signal EN, and a drain connected to the drain of transistor 101. Transistor 103 has a drain connected to the drain of transistor 101, a gate connected to line 122, and a source. Transistor 104 has a gate for receiving signal EN, a drain connecte to the source of transistor 103, and a source connected to ground. Transistor 106 has a source connected to VDD, a gate connected to line 121, and a drain. Transistor 107 has a gate connected to signal EN, a source connected to VDD, and a drain connected to the drain of transistor 106. Transistor 108 has a drain connected to the drain of transistor 106, a gate connected to line 121, and a source connected to the drain of transistor 104. Transistor 111 has a source connected to VDD, a gate connected to the drain of transistor 101, and a drain. Transistor 112 has a source connected to ground, a gate connected to the drain of transistor 101, and a drain connected to the drain of transistor 111. Transistor 113 has a source connected to VDD, a gate connected to the drain of transistor 106, and a drain. Transistor 114 has a drain connected to the drain of transistor 113, a gate connected to the drain of transistor 106, and a source connected to ground. Transistor 116 has a source connected to VDD, a gate connected to the drain of transistor 101, and a drain. Transistor 117 has a drain connected to VDD, a source connected to the drain of transistor 116, and a gate connected to the drain of transistor 111. Transistor 118 has a drain connected to the source of transistor 117, a source connected to ground, and a gate connected to the drain of transistor 113.

Line 122 receives signal DO(+) from secondary sense amplifier 69 of FIG. 3. Line 121 receives signal DO(−) from secondary sense amplifier 69 of FIG. 3. Cycle end signal CY switches to a logic low a predetermined time duration after a data cycle if another data cycle is not initiated before the predetermined time has elapsed. Signal WE is a logic high when memory 10 is in a write mode and a logic low when memory 10 is in a read mode. Signal WE is generated in response to an external write enable signal *WE (not shown). Signal EN is a logic high when memory 10 is either in the write mode or memory 10 is not enabled. Address stable signal *AS is either a logic low or is a logic high pulse. Signal *AS will switch to a logic high in response to an address transition and will remain at a logic high until the address becomes stable at which time it switches back to a logic low.

To perform a read, memory 10 must be in the read mode and must be enabled. In such case signal EN is a logic high and signal WE is a logic low. With signal WE at a logic high, NOR gate 72 is responsive to signal *CY. Similarly NAND gate 78 is responsive to the signal present on line 122 and NAND gate 79 is responsive to the signal present on line 121 with signal EN at a logic high. With signal EN at a logic high transistors 102 and 107 are non-conductive and transistor 104 is conductive. Inverters 81 and 82 in turn respond to the output of NAND gates 78 and 79, respectively. Output drive transistors 117 and 118 further in turn respond to inverters 81 and 82, respectively. Transistor 116 responds to the output of NAND gate 78. When the signal on line 122 is a logic high and the signal on line 121 is a logic low, signal D will be provided at a logic high. There are two inverting stages between lines 122 and 121 and output drive transistors 117 and 118, respectively. Transistor 116 acts as a pull-up transistor to ensure that signal D reaches a sufficiently high logic-high voltage. The common source connection of transistors 103 and 108 facilitates the efficient use of transistor 104 for both NAND gates 78 and 79.

An improvement also lies in latches 76 and 77 and in the use of transistors 86 and 87. The operation of transistors 86 and 87 result in an improvement by biasing secondary amplifier 69 at an output level which improves its performance and by causing signal D to remain tri-stated until signals DO(+) and DO(−) are valid. Consequently, signal D is tri-stated until it is valid. Signal D does not reverse itself coming out of tri-state which is desirable. Latches 76 and 77 offer the advantage of causing less capacitance to be added to lines 121 and 122 than has been added by the latches used in the prior art for latching a logic high. When signal *CY indicates that the cycle has ended, secondary amplifier 69 as well as primary sense amplifier 40 are tri-stated. At this time latches 74–77 are activated and latch the signal present on lines 121 and 122. The latching of signals on output lines such as lines 122 and 121 is known but latches 76 and 77 add less capacitance than those previously used for this purpose.

At the beginning of a cycle in which data is to be read, there is an address transition or a transition of signal *WE from a logic low to a logic high. In the case of an address transition, signal *AS pulses to a logic high. In the case of signal *WE switching from a logic low to a logic high, which indicates that memory 10 is switching from the write mode to the read mode, signal WE switches from a logic high to a logic low. While signal WE is a logic high, transistors 84 and 85 hold lines 121 and 122 to a logic low. When signal WE switches to a logic high, transistors 84 and 85 become non-conductive and lines 121 and 122 are no longer controlled by signal WE. When signal *AS is a logic high, transistors 86 and 87 are conductive which causes lines 121 and 122 to become a logic low. When the address becomes stable, signal *AS switches to a logic high which causes transistors 86 and 87 to become non-conductive. Lines 121 and 122 are thus precharged to a logic low awaiting valid data from secondary sense amplifier 69 following either an address transition or a transition of memory 10 from a read to a write.

With both lines 121 and 122 at a logic low, NAND gates 78 and 79 provide logic high outputs which causes inverters 81 and 82 to provide logic low outputs. Transistors 117 and 118 are thus both non-conductive. The logic high output of NAND gate 78 also causes transistor 116 to be non-conductive. Signal D is thus in a high impedance condition which is known as being tri-stated. This is the desired condition in the absence of valid data. Secondary sense amplifier 69 will begin developing a logic high signal on one of lines 121 and 122.

If line 122 begins receiving the logic high, NAND gate 78 will begin developing a logic low which will cause inverter 81 to begin developing a logic high output. As inverter 81 begins outputting a logic high, transistor 117 will become conductive. Similarly, as NAND gate 78 begins outputting a logic low, transistor 116 will become conductive. Transistors 116 and 117 thus begin developing the logic high output which is the valid logic state for signal D. The logic states of the outputs of NAND gate 79 and inverter 82 will not change because line 121 remained at a logic low. Transistor 118 therefore remains non-conductive.

If line 121 begins receiving the logic high from secondary sense amplifier 69, NAND gate 79 will begin developing a logic low output which will cause inverter 82 to begin developing a logic high output. As inverter 82 begins outputting a logic high, transistor 118 will become conductive. Transistor 118 thus begins developing the logic low output which is the valid logic state for signal D with line 121 at a logic high. The logic state of the output of NAND gate 78 will remain at a logic high in view of line 122 remaining at a logic low. Likewise the output of inverter 81 remains at a logic low. Transistors 116 and 117 thus remain non-conductive.

Output driver 71 is thus predisposed to a tri-state-only condition prior to receiving valid data. As valid data is received, output driver 71 responds by switching to the valid logic state. Signal D is thus either providing a high impedance or valid data with no intervening invalid data. Futhermore, the signal, signal *AS, which precharges lines 121 and 122 in a manner which brings driver 71 to the tri-state condition is not critically timed. Signal *AS will always release output driver 71 prior to receiving valid data so the timing of signal *AS will not add to the access time. The time required to precharge lines 121 and 122 to a logic low in response to an address transition is certain to be less than the time for valid data to be developed by the primary and secondary amplifiers. Consequently, the signal which releases secondary amplifier 69 out of tri-state will occur after signal *AS has released output driver 71 to receive valid data. In the past output drivers have been predisposed to either a logic high or a logic low in the case in which the output driver is released before valid data is already driving the output driver. This can result in providing an invalid logic state between the tri-state and valid data conditions.

Prior to expiration of the predetermined time for cycle end, signal *CY is a logic high so that the output of NOR gate 72 is a logic low which causes transistors 88 and 92 to be non-conductive. The logic low output of NOR gate 72 causes inverter 73 to provide a logic high output which causes transistors 93 and 98 to be non-conductive. With transistors 88, 92, 93, and 98 non-conductive, latches 74, 75, 76, and 77 are disabled. When the predetermined time following a data cycle has lapsed, signal *CY switches to a logic low which causes NOR gate 72 to provide a logic high output and inverter 73 to provide a logic low output. In this case transistors 88, 92, 93, and 98 become conductive, enabling latches 74–77. Latches 74 and 75 are useful for latching a logic low and latches 76 and 77 are useful for latching a logic high.

Assume that a logic high is present on line 122 and a logic low is present on line 121. Latch 75 latches the logic low on line 122 via the path to ground provided by transistors 91 and 92. Transistor 91 is conductive by virtue of the logic high present on line 122. Latch 74 is non-functional in this case because transistor 89 is non-conductive by virtue of the logic low on line 121. Latch 76 latches the logic high present on line 122. Inverter 96 provides a logic low output to transistor 94 in view of the logic high on line 122. The logic low output of inverter 96 causes transistor 94 to be conductive. Transistor 93 has become conductive because inverter 73 has switched to a logic low in response to signal *CY switching to a logic low. There is thus provided a path from VDD to line 122 to latch line 122 in the logic high condition. Latch 77 is not operational in this condition because inverter 99 provides a logic high output which keeps transistor 97 non-conductive.

The advantage of latch 76 over that of the prior art is reduced capacitance added to line 122. In the prior art, the gate of transistor 94 was connected to line 121. This added the gate capacitance of transistor 94 to line 121. Similarly, the gate of transistor 97 was connected to line 122 which added the gate capacitance of transistor 97 to line 122. The gate capacitance is directly proportional to the gate dimensions so that a larger gate area has a larger capacitance assuming other factors are the same. Transistors 94 and 97 are quite a bit larger than the minimum size. The transistors which comprise inverters 96 and 99, on the other hand, can be quite small. The P channel transistors, which contribute almost all of the capacitance in a logic low input condition, which are used in inverters 96 and 99 are less than one third the area of transistors 94 and 97. The gates of N channel transistors connected to lines 122 and 121 contribute almost no capacitance to lines 121 and 122 at the critical sensing time because, previous to the critical sensing time, lines 121 and 122 have been precharged to ground.

The gate capacitance of an N channel transistor when its gate is grounded is very much smaller than when its gate is at a logic high. When the gate is at a logic high, the underlying channel is depleted which establishes a relatively large capacitance between the gate and the channel. Consequently, the contribution to the capacitance of lines 121 and 122 of transistors 89 and 91 at the critical sensing time is quite small. There is thus no need for latches analogous to latches 76 and 77 in place of latches 74 and 75.

The channel of a P channel transistor which has its gate at a logic low is depleted so that there is relativley more capacitance between the gate and the channel than when the gate is at a logic high. Consequently, the gate capacitance of a P channel transistor with its gate connected to lines 122 or 121 can add significantly to the capacitance of the line to which it is connected at the critical sensing time when lines 121 and 122 are at a logic low.

Latches 76 and 77 connected to lines 121 and 122 constitute an improvement by reducing the capacitance on lines 121 and 122.

The source-coupled pair comprised of transistors 103 and 108 have transistor 104 to act as current control. It is at this stage that a transition from an analog to digital level is complete. Transistors 103, 108, and 104 comprise a a source-coupled amplifier. Output buffer 71 is common-mode matched to the secondary sense amplifier 69 in the same way that sense amplifier 69 is common-mode matched to primary sense amplifier 40. Thus, improved gain is obtained in the transfer of analog information into the output buffer and in converting the analog signal to a digital level.

We claim:

1. In a memory having an array of memory cells, each memory cell for containing data therein in the form of a first pair of differential signals; decoder means for selecting a memory cell in response to an address; transition detection means for providing a pulse in response to a transition of the address; and a sense amplifier for receiving data from the selected memory cell and for providing a pair of differential signals representative of the data received from the selected memory cell; an output driver comprising:

a first input line for receiving a first signal of the pair of differential signals;

a second input line for receiving a second signal of the pair of differential signals;

tri-state means for applying predetermined logic states to the first and second input lines in response to said pulse;

a first transistor having a first current electrode coupled to a first power supply terminal, a second current electrode for providing an output signal of the memory, and a control electrode;

first logic means, having a first input coupled to the first input line, an output coupled to the control electrode of the first transistor, and a second input for receiving a disable signal, for providing said output at a logic state which causes the first transistor to be non-conductive when the disable signal is present and for providing said output at a logic state responsive to a logic state present on the first input line when the disable signal is not present, said logic state which causes the first transistor to be non-conductive being provided in response to the predetermined logic state provided to the first input line by the tri-state means in response to the pulse;

a second transistor having a first current electrode coupled to a second power supply terminal, a second current electrode coupled to the second current electrode of the first transistor, and a control electrode; and second logic means, having a first input coupled to the second input line, an output coupled to the control electrode of the second transistor, and a second input for receiving the disable signal, for providing said output at a logic state which causes the second transistor to be non-conductive when the disable signal is present and for providing said output at a logic state responsive to a logic state present on the second input line when the disable signal is not present, said logic state which causes the second transistor to be non-conductive being provided in response to the predetermined logic state provided to the second input line by the tri-state means in response to the pulse.

2. The memory of claim 1 further comprising:

a first latch coupled to the first input line for latching the logic state present thereat in response to a latch enable signal; and a second latch coupled to the second input line for latching the logic state thereat in response to the latch enable signal.

3. The memory of claim 1, wherein the first latch comprises:

a first inverter having an input coupled to the first input line, and an output;

a third transistor having a first current electrode coupled to the first input line, a control electrode coupled to the output of the first inverter, and a second current electrode;

a fourth transistor having a first current electrode coupled to the second current electrode of the third transistor, a control electrode for receiving the latch enable signal, and a second current electrode coupled to the first power supply terminal.

4. In a memory having an array of memory cells, each memory cell for containing data therein in the form of a first pair of differential signals; decoder means for selecting a memory cell in response to an address; and a sense amplifier for receiving data from the selected memory cell and for providing a pair of differential signals representative of the data received from the selected memory cell; an output driver comprising:

a first input line for receiving a first signal of the pair of differential signals;

a second input line for receiving a second signal of the pair of differential signals;

a first transistor having a first current electrode coupled to a first power supply terminal, a second current electrode for providing an output signal of the memory, and a control electrode;

first logic means, having a first input coupled to the first input line, an output coupled to the control electrode of the first transistor, and a second input for receiving a disable signal, for providing said output at a logic state which causes the first transistor to be non-conductive when the disable signal is present and for providing said output at a logic state responsive to a logic state present on the first input line when the disable signal is not present;

a second transistor having a first current electrode coupled to a second power supply terminal, a second current electrode coupled to the second current electrode of the first transistor, and a control electrode; and second logic means, having a first input coupled to the second input line, an output coupled to the control electrode of the second transistor, and a second input for receiving the disable signal, for providing said output at a logic state which causes the second transistor to be non-conductive when the disable signal is present and for providing said output at a logic state responsive to a logic state present on the second input line when the disable signal is not present;

a first inverter having an input coupled to the first input line, and an output;

a third transistor having a first current electrode coupled to the first input line, a control electrode coupled to the output of the first inverter, and a second current electrode;

a fourth transistor having a first current electrode coupled to the second current electrode of the third transistor, a control electrode for receiving the latch enable signal, and a second current electrode coupled to the first power supply terminal;

a second inverter having an input coupled to the second input line, and an output;

a fifth transistor having a first current electrode coupled to the second input line, a control electrode coupled to the output of the first inverter, and a second current electrode;

a sixth transistor having a first current electrode coupled to the second current electrode of the fifth transistor, a control electrode for receiving the latch enable signal, and a second current electrode coupled to the first power supply terminal.

5. In a memory having an array of memory cells, each memory cell for containing data therein in the form of a first pair of differential signals; decoder means for selecting a memory cell in response to an address; and a sense amplifier for receiving data from the selected memory cell and for providing a pair of differential signals representative of the data received from the selected memory cell; an output driver comprising:

a first input line for receiving a first signal of the pair of differential signals;

a second input line for receiving a second signal of the pair of differential signals;

a first transistor having a first current electrode coupled to a first power supply terminal, a second current electrode for providing an output signal of the memory, and a control electrode;

a second transistor having a first current electrode coupled to a second power supply terminal, a second current electrode coupled to the second current electrode of the first transistor, and a control electrode;

a third transistor having a first current electrode coupled to the control electrode of the first transistor, a control electrode coupled to the first input line, and a second current electrode;

a fourth transistor having a first current electrode coupled to the control electrode of the second transistor, a control electrode coupled to the second input line, and a second current electrode coupled to the second current electrode of the third transistor; and a fifth transistor having a first current electrode coupled to the second current electrodes of the third and fourth transistors, a second current electrode coupled to the second power supply terminal, and a control electrode for receiving an enable signal.

6. The memory of claim 5 further comprising:

transition detection means for providing a pulse in response to an address transition; and tri-state means for applying predetermined logic states to the first and second input lines in response to said pulse.

7. The memory of claim 6 wherein the tri-state means applies the predetermined logic states to the first and second input lines by coupling the second power supply terminal thereto in response to the pulse.

8. The memory of claim 7 further comprising:

a first inverter having an input coupled to the first input line, and an output;

a third transistor having a first current electrode coupled to the first input line, a control electrode coupled to the output of the first inverter, and a second current electrode; and a fourth transistor having a first current electrode coupled to the second current electrode of the third transistor, a control electrode for receiving the latch enable signal, and a second current electrode coupled to the first power supply terminal.

* * * * *